United States Patent [19]

Kuwabara et al.

[11] Patent Number: 4,818,835
[45] Date of Patent: Apr. 4, 1989

[54] LASER MARKER AND METHOD OF LASER MARKING

[75] Inventors: Kouji Kuwabara; Makoto Yano, both of Hitachi; Takao Umeda, Mito, all of Japan

[73] Assignee: Hitachi, Ltd., Tokyo, Japan

[21] Appl. No.: 160,829

[22] Filed: Feb. 26, 1988

[30] Foreign Application Priority Data

Mar. 2, 1987 [JP] Japan .................................. 62-45251

[51] Int. Cl.[4] ............................................. B23K 26/00
[52] U.S. Cl. ............................. 219/121.6; 219/121.85; 346/76 L
[58] Field of Search .... 219/121 L, 121 LM, 121 LH, 219/121 LJ, 121 LS, 121 LT, 121 LU; 346/76 L, 107, 108; 350/358, 354, 337 W, 350 R, 330; 372/9, 10, 11, 12, 13

[56] References Cited

U.S. PATENT DOCUMENTS 4,559,546 12/1985 Yip .................................. 346/108 X
4,614,954 9/1986 Ohta et al. ...................... 346/107 R Primary Examiner—C. L. Albritton
Attorney, Agent, or Firm—Antonelli, Terry & Wands

[57] ABSTRACT

A laser marker comprises a liquid crystal device for displaying pattern information representative of a character to be printed on an object to be worked, a pulse laser oscillator, a liquid crystal device power switch connected to the liquid crystal device, a laser switch connected to the pulse laser oscillator, and timer circuits operative to retard the operation of the laser switch with respect to that of the liquid crystal device power switch, whereby after the character to be printed is displayed properly on the liquid crystal device, a pulse laser beam is irradiated on the liquid crystal device so as to sharply print the character on the object.

8 Claims, 4 Drawing Sheets

LASER MARKER AND METHOD OF LASER MARKING

BACKGROUND OF THE INVENTION

1. Field of the Invention

This invention relates to a laser marker and a method of laser marking which use a liquid crystal device as a pattern mask by which pattern information is applied to an object to be worked in order to print the same.

2. Description of the Prior Art

Generally, an object to be worked, for example, an electronic part is printed with such characters as its product number, manufacture date and name with a view of demonstrating its source. Conventionally, a pattern mask for this purpose is prepared by etching a metal sheet to form therein through-holes corresponding to a character standing for pattern information. After the pattern mask is applied on the electronic part and a paint is then coated on the pattern mask, the pattern mask is removed so that the character can be transferred to the electronic part. According to this conventional method, the pattern mask must be exchanged adaptively for different kinds of electronic parts and disadvantageously, the time-consuming exchange work is required and many kinds of pattern masks have to be prepared.

As a countermeasure, a laser marker has been proposed as disclosed in JP-A No. 60-174671. In the laser marker, a liquid crystal device used as a pattern mask is interposed between a laser ascillator and an object to be worked, a voltage representative of a character to be printed on the object is applied to a display portion of the liquid crystal device and a laser beam is then irradiated on the liquid crystal device, so that only the laser beam which has passed through the character can pass through a polarizer plate and irradiate the object to print the character thereon.

However, the resulting print is sometimes sharp and sometimes dim. The cause of this incomplete print has been studied thoroughly by the inventors of the present application and elucidated as will be described below.

FIGS. 1A and 1B illustrate a liquid crystal device 13 in use. Particularly, when a voltage of a power supply 29 is not applied as shown at FIG. 1A, liquid crystal molecules are twisted between electrodes 13A, as depicted at reference numeral 13C. Accordingly, a linearly polarized (for example, P polarized in direction y) incident laser beam 12A is converted into a linearly polarized output laser beam 12B whose plane of polarization is 90° rotated (direction z) with respect to that of the incident laser beam 12A.

As shown FIG. 1B, when a liquid crystal device power switch 25 is turned on to apply the voltage across the electrodes 13A, the liquid crystal molecules are oriented in the direction of electric field E to take the operational state, as depicted at reference numeral 13B. Under this condition, the incident laser beam 12A can pass through the liquid crystal device 13 without having its plane of polarization rotated.

The liquid crystal molecules take a response time to reach the operational state following the closure of the power switch 25 or to recover the original twisted state from the operational state and the response time is about 0.2 to 0.5 seconds, though depending on the kind of the liquid crystal molecules. Accordingly, if the incident laser beam 12A is irradiated over the duration of the response time, then the output laser beam 12A is elliptically polarized. The elliptically polarized laser beam is partly shielded by the succeeding polarizer plate, with the result that a laser beam leaving the polarizer plate is decreased in quantity of light as compared to that of the incident laser beam 12A and fails to print a sharp character on an object to be worked.

SUMMARY OF THE INVENTION

An object of this invention is to provide a laser marker capable of sharply printing pattern information on an object to be worked.

Another object of this invention is to provide a method of laser marking which takes account of operation times of a liquid crystal device and a pulse laser oscillator to efficiently print pattern information on an object to be worked.

According to this invention, operation time of a laser switch adapted to control the operation of the pulse laser oscillator is retarded with respect to operation time of a liquid crystal device power switch adapted to control the operation of the liquid crystal device so that after the liquid crystal device has been brought into its operational state, the laser switch can be actuated to permit a laser beam to irradiate the liquid crystal device, thereby attaining sharp and efficient print of the pattern information on the object to be worked.

DESCRIPTION OF THE PREFERRED EMBODIMENTS

Figure 2:
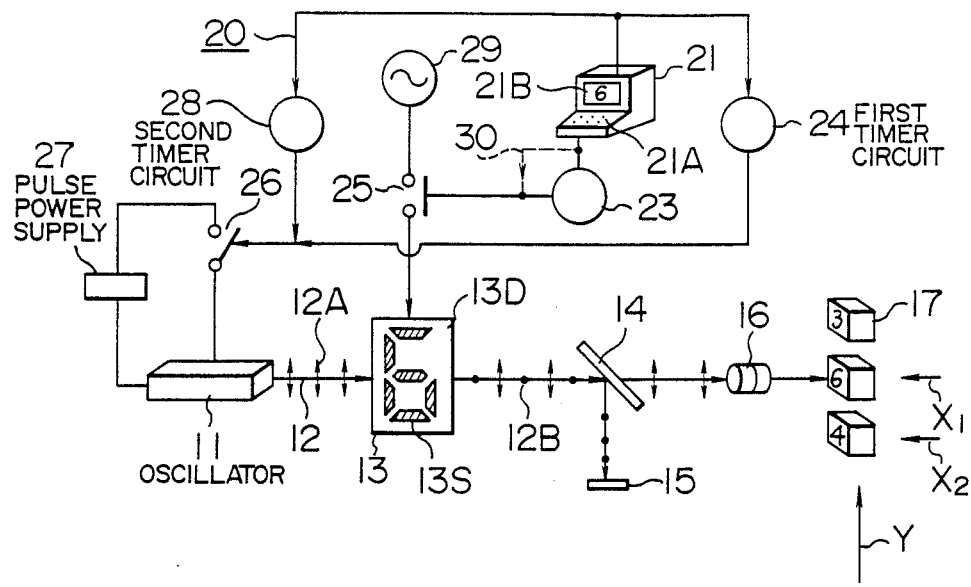
FIG. 2 is a schematic diagram illustrating a laser marker according to an embodiment of the invention.
Figure 3:
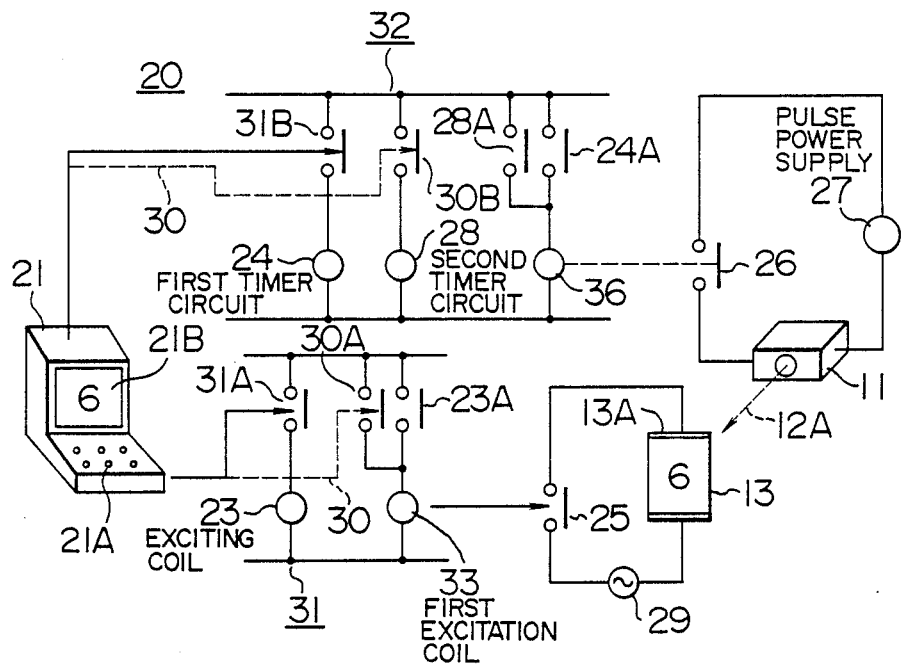
FIG. 3 is an equivalent circuit diagram of FIG. 2 laser marker.
Figure 4:
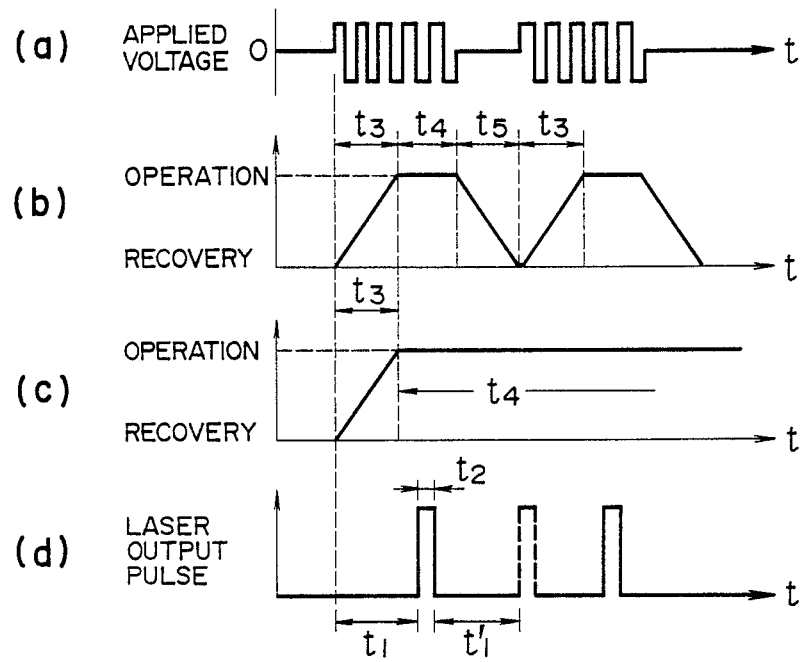
FIG. 4 is a timing chart illustrating, at sections (a) through (d), the operation of the laser marker shown in FIGS. 2 and 3.

A laser marker according to an embodiment of the invention will now be described with reference to FIGS. 2 to 4.

A pulse laser oscillator 11 is a solid-state laser as represented by, for example, a YAG laser. A pulse laser beam 12 emitted from the oscillator 11 is of, for example, a P polarized laser beam 12A which irradiates a liquid crystal device 13. The liquid crystal device 13 has electrodes 13A and a display portion 13D, and when a voltage is applied to the electrodes 13A, pattern information such as a character "6" is displayed on the display portion. Under this condition, the P polarized beam 12A incident on the display portion 13D partly passes through the character "6" to provide an output laser beam of the same polarization plane and partly passes through the rest of the display portion to provide an S polarized output laser beam 12B having a polarization plane which is 90° rotated with respect to that of the incident beam 12A. The P polarized and S polarized output laser beams then irradiate a polarizer plate 14. The S polarized beam 12B is reflected at the polarizer plate 14 and absorbed by an absorber plate 15. The P polarized beam 12A is permitted to pass through the polarizer plate 14 and passes through an optical focusing lens 16 to print the character "6" on an electronic part 17 standing for an object to be worked. Electronic parts 17 are carried on a belt conveyor, not shown, and conveyed in a direction of arrow Y. The irradiation of the P polarized beam 12A is effected in timed relationship with the conveyance of the electronic parts 17 by means of a controller 20 as illustrated in FIG. 2.

Figure 1A:
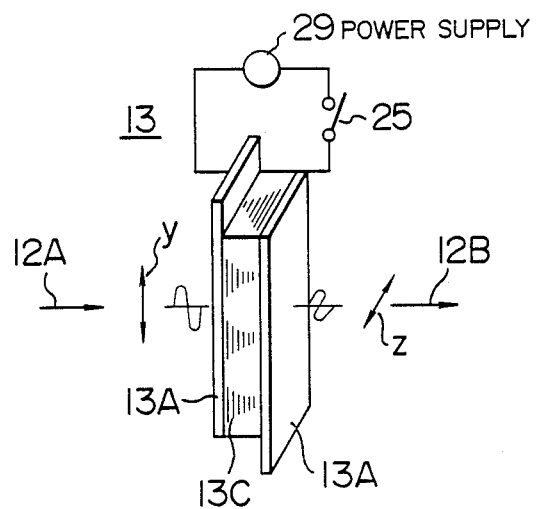
FIGS. 1A and 1B illustrate a liquid crystal device in use to explain its operation.
Figure 1B:
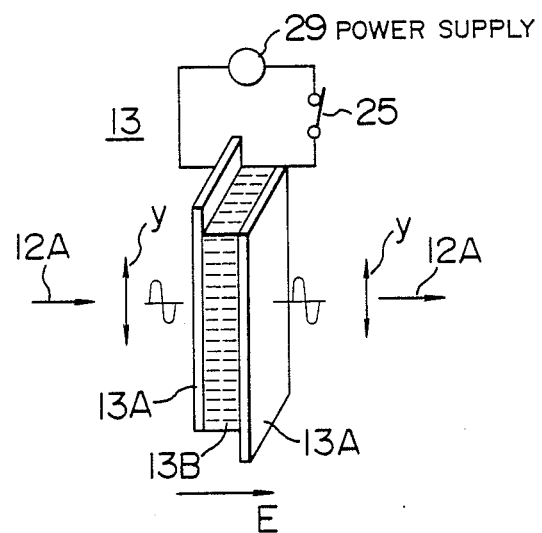

The controller 20 is constructed as will be described below. A control console 21 has an operation panel 21A and a display unit 21B. When a character "6" is inputted by manipulating the operation panel 21A, the character "6" is displayed on the display unit 21B and this input signal flows through an exciting coil 23 and first and second timer circuits 24 and 28. The thus excited coil 23 closes liquid crystal device power switches 25 through a liquid crystal operation circuit 31 to be described later. Although only one switch 25 is illustrated in FIG. 2, a plurality of liquid crystal device power switches 25 are provided in association with respective segments 13S, forming one of the electrodes 13A, of the liquid crystal device 13. With the liquid crystal device power switches 25 closed, a voltage V as shown as section (a) in FIG. 4 is fed from an AC power supply 29 and applied across the electrodes 13A to drive the liquid crystal device 13. Liquid crystal molecules which are twisted as depicted at 13C in FIG. 1A in the absence of applied voltage are oriented in one direction to take the operational state as depicted at 13B in FIG. 1B under the application of the voltage V across the electrodes. The operational state is maintained during an interval of operation time $t_4$ as shown at section (b) in FIG. 4. The twisted liquid crystal molecules as depicted at 13C take a response time $t_3$ to reach the operational state as depicted at 13B. Conversely, the liquid crystal molecules in the operational state take a recovery time $t_5$ to recover the twisted state.

The first timer circuit 24 is not operated or closed during an interval of response time $t_3$ and an interval of recovery time $t_5$ but is operated only during the interval of operation time $t_4$ to close a laser switch 26 through a laser operation circuit 32. With the laser switch 26 closed, a voltage from a pulse power supply 27 is applied to the pulse laser oscillator 11 and the irradiation of the P polarized beam 12A emitted from the pulse laser 11 is permitted only during an interval of irradiation time $t_2$ as shown at (d) in FIG. 4. The second timer circuit 28 is permitted to operate or close only during the interval of irradiation time $t_2$ an is not operated during an interval of non-irradiation time $t_1$ and an interval of non-irradiation time $t_1'$. When the second timer circuit 28 is operated, a hold circuit 30 inserted between the control console 21 and the liquid crystal device power switch 25 can be operated. The operation of the hold circuit 30 will be described hereinafter.

The controller 20 operates as will be described below.

By inputting an input signal representative of a character "6" from the operation panel 21A, key-in contacts 31A and 31B are closed. The first timer circuit 24 remains deactivated for retarding but the exciting coil 23 is excited to close its auxiliary contact 23A, thus exciting a first excitation coil 33 associated with the liquid crystal device so as to close the liquid crystal device power switch 25. Consequently, the voltage V shown at (a) in FIG. 4 is applied to the liquid crystal device 13. Under the application of the voltage V, the liquid crystal molecules in liquid crystal device 13 twisted in the absence of applied voltage change, through response time $t_3$, to take the operational state depicted at 13B in FIG. 1 at the beginning of operation time $t_4$. At that time, the first timer circuit 24 is operated or closed to close its auxiliary contact 24A, exciting a second excitation coil 36 associated with the laser power supply so as to close the laser switch 26. Consequently, the pulse voltage from the pulse power supply 27 is applied to the pulse laser oscillator 11. A P-polarized beam 12A emitted from the pulse laser oscillator 11 irradiates the liquid crystal device 13 during the interval of irradiation time $t_2$, as shown at (d) in FIG. 4. This ensures that the incident laser beam can pass through part of liquid crystal molecules to which the voltage is applied to provide a linearly polarized (P polarized) output laser beam which in turn is used to sharply print the character "6" on an electronic part 17.

In this embodiment, the operation time of the laser switch 26 can be retarded by means of the first timer circuit 24 with respect to that of the liquid crystal device power switch 25 in this manner, thus permitting the P polarized beam 12A to be irradiated only during the interval of operation time $t_4$ in which the liquid crystal device 13 is exactly placed in the operational state. As a result, the conversion of linear polarization into elliptical polarization does not occur which would otherwise be caused when the P polarized incident beam 12A is irradiated during the interval of response time $t_3$ or recovery time $t_5$, and the laser beam not suffering from a decrease in intensity can be used to sharply print the character "6" on the electronic part 17.

While in the foregoing embodiment the operation of the laser switch 26 is retarded using the first timer circuit 24, the laser switch 26 may be closed manually without resort to the first timer circuit 24 during the interval of operation time $t_4$ after the closure of liquid crystal device power switch 25.

After completion of print of the character "6", the input signal keyed in from the operation panel 21A is invalidated and an input signal representative of a different character is then inputted from the operation panel. Through the same operation as above, this input signal is processed to sharply print the different character on an electronic part.

Many electronic parts 17 can be printed with the same character, for example, "6" in a manner as will be described below. When an input signal representative of a character "6" is keyed in by manipulating the operation panel 21A, the hold circuit 30 as indicated by broken line is operated to close hold contacts 30A and 30B but the second timer circuit 28 remains deactivated. At that time, since the first excitation coil 33 is excited, the liquid crystal device power switch 25 is closed and the liquid crystal device 13 is brought into the operational state at the beginning of the interval of operation time $t_4$. The operational state then keeps continuing by the action of the hold circuit 30, as shown at (c) in FIG. 4. While the liquid crystal device being placed in the operational state, the second timer circuit 28 is operated or closed to close the auxiliary contact 28A, causing the P polarized beam 12A to be irradiated only during the interval of irradiation time $t_2$ and thereafter the second timer circuit 28 is deactivated or opened during the interval of non-irradiation time $t_1'$, followed by repetition of the operation and deactivation of the second timer circuit 28 to print the same character on many electronic parts 17.

In this instance, one of electronic parts 17 conveyed in the direction of arrow Y must be irradiated with the P polarized beam 12A at an irradiation position $X_1$. Therefore, the running speed of the belt conveyor in the direction of arrow Y, for example, is so adjusted that the interval of times $t_3$, $t_5$ or $t_1$, $t_1'$ can be synchronized with time for one electronic part to move from a position $X_2$ to the position $X_1$. In this way, the interval of response time, recovery time or non-irradiation time during which the pulse laser oscillator 11 is deactivated can be spent for moving the electronic part and consequently the printing work can advantageously be performed without degrading its efficiency. Thus, for improving efficiency of the printing work, the running speed in the Y direction and time of the respective timer circuits are so adjusted that the P polarized beam 12A is irradiated on the electronic part 17 when the electronic part is temporarily stopped at the irradiation position $X_1$ and that the irradiation is stopped during the interval of times $t_1$, $t_1'$, $t_3$ and $t_5$ other than irradiation time $t_2$.

Figure 5:
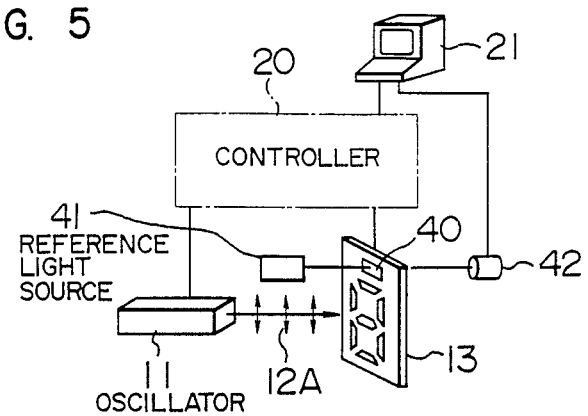
FIGS. 5, 6 and 7 are schematic diagrams illustrating laser markers according to other embodiments of the invention.

Referring to FIG. 5, there is illustrated a laser marker according to another embodiment of the invention. In this embodiment, a liquid crystal operation indicator 40 is provided at a part of a liquid crystal device 13 and is connected to a reference light source 41 and a detector 42. With this construction, even when the response time of the liquid crystal device 13 changes as the ambient temperature changes, a change in the response time is detected by the detector 42 and compensated for by means of the control console 21 in order to sharply print a character on an object to be worked.

Figure 6:
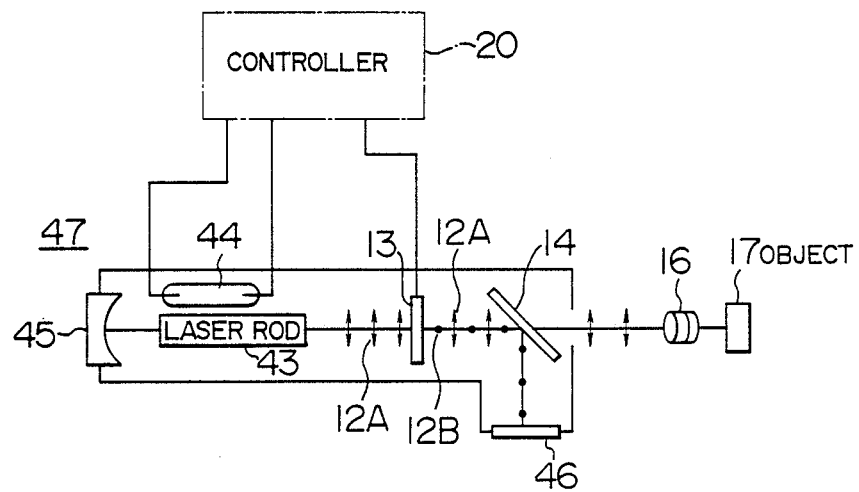

FIG. 6 illustrates a laser marker according to still another embodiment of the invention. In this embodiment, a liquid crystal device 13 and a polarizer plate 14 are disposed inside a laser oscillator 47. A P-polarized incident beam 12A generated by exciting a laser rod 43 by means of an excitation lamp 44 is partly passed through the liquid crystal device 13 to provide a P polarized output beam 12A reflecting a pattern of the liquid crystal device 13 and partly passed through the liquid crystal device 13 to provide an S polarized beam 12B having a polarization plane which is 90° rotated with respect to that of the incident beam 12A. The two output beams are separated from each other by means of the polarizer plate 14 and the P polarized output beam 12A is focused by means of a focusing optical system 16 on an electronic part 17 to print the same. The S polarized output beam 12B, on the other hand, is reflected at a reflection mirror 46, returning to the polarizer plate 14 and is directed to the liquid crystal device 13 at which the returning S polarized beam is converted into a P polarized beam. The thus converted P polarized beam passes through the laser rod 43 to reach a full-reflection mirror 45 at which the incident P polarized beam is reflected to return to the liquid crystal device 13 after being amplified. In this embodiment, the opposite ends of excitation lamp 44 and the liquid crystal device 13 are connected to a controller 20 having the same construction as that of the controller 20 described in connection with FIGS. 2 and 3.

Figure 7:
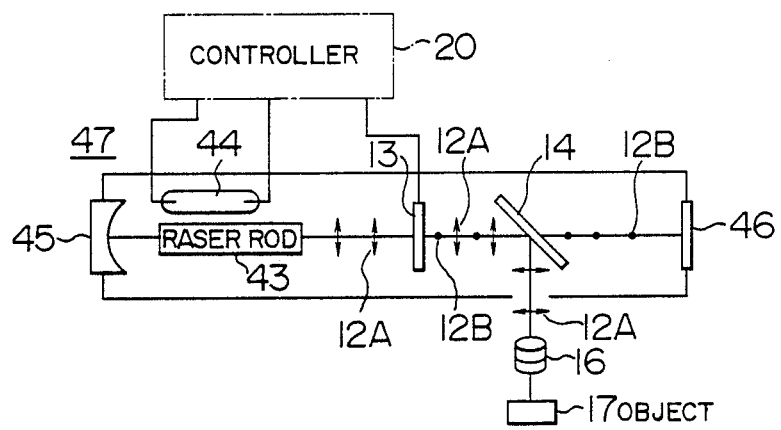

FIG. 7 illustrates a modification of the FIG. 6 embodiment. In comparison with the FIG. 6 embodiment, the disposition of reflection mirror 46 and the disposition of focusing optical system 16 and electronic part 17 are exchanged with each other, so that the full-reflection mirror 45 and reflection mirror 46 may be aligned to facilitate optical adjustment.

Since in the FIG. 6 embodiment and the FIG. 7 modification the reflection mirror 46 and full-reflection mirror 45 optically oppose to each other with the laser rod 43 interposed therebetween in order to return to the laser rod 43 the S polarized beam 12B which has not been utilized purposely, a disadvantage of the mask type laser marker, that is, the low utilization percentage of the laser beam (normally, 20 to 30% of the laser beam emitted from the laser is used for printing and the rest is consumed as a loss in the form of scattering and heat) can considerably be compensated for.

As described above, the laser marker of the present invention can print sharp characters on objects to be worked.

We claim:

1. A laser marker comprising:
   a laser oscillator;
   a liquid crystal device irradiated with a laser beam emitted from said laser oscillator and applied with pattern information representative of a character to be printed on an object to be worked;
   a polarizer plate for irradiating a laser beam reflecting the pattern information of said liquid crystal device on said object;
   a liquid crystal operation circuit and a laser operation circuit respectively connected to said liquid crystal device and said laser oscillator;
   a liquid crystal device power switch and a laser switch respectively provided in said liquid crystal operation circuit and laser operation circuit, for operating said liquid crystal device and laser oscillator; and
   delay means for retarding operation time of said laser switch with respect to that of said liquid crystal device power switch.

2. A laser marker comprising:
   a laser oscillator;
   a liquid crystal device irradiated with a laser beam emitted from said laser oscillator and applied with pattern information representative of a character to be printed on an object to be worked;
   a polarizer plate for irradiating a laser beam reflecting the pattern information of said liquid crystal device on said object;
   a liquid crystal operation circuit and a laser operation circuit respectively connected to said liquid crystal device and said laser oscillator;
   a liquid crystal device power switch and a laser switch respectively provided in said liquid crystal operation circuit and laser operation circuit, for operating said liquid crystal device and laser oscillator; and
   hold means for holding the operation of said liquid crystal device power switch provided in said liquid crystal operation circuit.

3. A method of operating a laser marker comprising a laser oscillator, a liquid crystal device irradiated with a laser beam emitted from said laser oscillator and applied with pattern information representative of a character to be printed on an object to be worked, a polarizer plate for irradiating a laser beam reflecting the pattern information on said object, a liquid crystal operation circuit and a laser operation circuit respectively connected to said liquid crystal device and said laser oscillator, and a liquid crystal device power switch and a laser switch respectively provided in said liquid crystal operation circuit and laser operation circuit, for operating said liquid crystal device and laser oscillator, said method comprising the steps of:
   applying a voltage to said liquid crystal device;

irradiating a pulse laser beam on said liquid crystal device during an interval of operation time of said liquid crystal device; and one of retarding an operation time of said laser switch with respect to that of said liquid crystal device power switch and holding the operation of said liquid crystal device power switch.

4. A method of operating a laser marker comprising a laser oscillator, a liquid crystal device irradiated with a laser beam emitted from said laser oscillator and applied with pattern information representative of a character to be printed on an object to be worked, a polarizer plate for irradiating a laser beam reflecting the pattern information on said object, a liquid crystal operation circuit and a laser operation circuit respectively connected to said liquid crystal device and said laser oscillator, and a liquid crystal device power switch and a laser switch respectively provided in said liquid crystal operation circuit and laser operation circuit, for operating said liquid crystal device and laser oscillator, said method comprising the steps of:

applying a voltage to said liquid crystal device;

irradiating a pulse laser beam on said liquid crystal device during an interval of operation time of said liquid crystal device; and moving said object by adjusting the running speed of said object and the irradiation time in such a manner that said object is moved during opening of said laser switch and temporarily stopped at an irradiation position where said object is irradiated with said laser beam.

5. A laser marker comprising:

a laser oscillator having an optical resonator comprised of a set of reflection mirrors opposing to each other with a laser rod interposed therebetween and an excitation lamp;

a transmission type liquid crystal device disposed between said laser rod and one of said opposing reflection mirrors and applied with pattern information representative of a character to be printed on an object to be worked;

a polarizer plate for delivering a laser beam reflecting the pattern information of said liquid crystal device out of said optical resonator and for irradiating the laser beam on said object;

a liquid crystal operation circuit and a laser operation circuit respectively connected to said transmission type liquid crystal device and said excitation lamp;

a liquid crystal device power switch and a laser switch respectively provided in said liquid crystal operation circuit and laser operation circuit, for operating said transmission type liquid crystal device and said excitation lamp; and delay means for retarding operation time of said laser switch with respect to that of said liquid crystal device power switch.

6. A laser marker comprising:

a laser oscillator having an optical resonator comprised of a set of reflection mirrors opposing to each other with a laser rod interposed therebetween and an excitation lamp;

a transmission type liquid crystal device disposed between said laser rod and one of said opposing reflection mirrors and applied with pattern information representative of a character to be printed on an object to be worked;

a polarizer plate for delivering a laser beam reflecting the pattern information of said liquid crystal device out of said optical resonator and for irradiating the laser beam on said object;

a liquid crystal operation circuit and a laser operation circuit respectively connected to said transmission type liquid crystal device and said excitation lamp;

a liquid crystal device power switch and a laser switch respectively provided in said liquid crystal operation circuit and laser operation circuit, for operating said transmission type liquid crystal device and said excitation lamp; and hold means for holding the operation of said liquid crystal device power switch provided in said liquid crystal operation circuit.

7. A method of operating a laser marker comprising a laser oscillator having an optical resonator comprised of a set of reflection mirrors opposing to each other with a laser rod interposed therebetween and an excitation lamp, a transmission type liquid crystal device disposed between said laser rod and one of said opposing reflection mirrors and applied with pattern information representative of a character to be printed on an object to be worked, a polarizer plate for delivering a laser beam reflecting the pattern information of said liquid crystal device out of said optical resonator and for irradiating the laser beam on said object, a liquid crystal operation circuit and a laser operation circuit respectively connected to said transmission type liquid crystal device and said excitation lamp, and a liquid crystal device power switch and a laser switch respectively provided in said liquid crystal operation circuit and laser operation circuit, for operating said transmission type liquid crystal device and said excitation lamp, said method comprising the steps of:

applying a voltage to said liquid crystal device;

irradiating a pulse laser beam on said liquid crystal device during an interval of operation time of said liquid crystal device; and moving said object by adjusting the running speed of said object and the irradiation time in such a manner that said object is moved during opening of said laser switch and temporarily stopped at an irradiation position where said object is irradiated with said laser beam.

8. A laser marker comprising:

a laser oscillator having an optical resonator comprised of a set of reflection mirrors opposing to each other with a laser rod interposed therebetween and an excitation lamp;

a transmission type liquid crystal device disposed between said laser rod and one of said opposing reflection mirrors and applied with pattern information representative of a character to be printed on an object to be worked; and an optical element for delivering a laser beam reflecting the pattern information of said liquid crystal device out of said optical resonator and for irradiating the laser beam on said object.

* * * * *